United States Patent [19]

Cikotte et al.

[11] Patent Number: 5,349,296
[45] Date of Patent: Sep. 20, 1994

[54] MAGNETIC RESONANCE SCAN SEQUENCER

[75] Inventors: Leonard J. Cikotte, Solon; Wayne R. Dannels, Richmond Heights; Thomas R. McBride, Newbury, all of Ohio

[73] Assignee: Picker International, Inc., Highland Hts., Ohio

[21] Appl. No.: 89,247

[22] Filed: Jul. 9, 1993

[51] Int. Cl.$^5$ .............................................. G01R 33/20
[52] U.S. Cl. ..................................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 3,674,998 | 7/1972 | Benz | 364/485 |
| 4,680,547 | 7/1987 | Leue et al. | 324/309 |
| 4,689,564 | 8/1987 | Leue et al. | 324/309 |
| 4,694,254 | 9/1987 | Vatis et al. | 324/309 |
| 4,698,591 | 10/1987 | Glover et al. | 324/307 |
| 4,707,661 | 11/1987 | Hoenninger, III et al. | 324/309 |
| 4,707,797 | 11/1987 | Briggs | 364/607 |
| 4,710,716 | 12/1987 | Keren et al. | 324/309 |
| 4,727,326 | 2/1988 | Kaplan et al. | 324/309 |
| 4,743,851 | 5/1988 | Lim et al. | 324/309 |
| 4,761,612 | 8/1988 | Holland et al. | 324/307 |
| 4,775,835 | 10/1988 | Kikuchi | 324/312 |
| 4,845,613 | 7/1989 | Netter et al. | 364/200 |
| 4,928,063 | 5/1990 | Lampman et al. | 324/307 |
| 5,144,242 | 9/1992 | Zellenga et al. | 324/312 |

Primary Examiner—Michael J. Tokar
Attorney, Agent, or Firm—Fay, Sharpe, Beall, Fagan, Minnich & McKee

[57] ABSTRACT

A magnetic resonance imaging magnet, gradient coil, and RF coil assembly is controlled by a workstation (40). The workstation (40) includes an operator input (46, 48) and a display system (58) including a video monitor (44) for displaying human-readable images reconstructed from magnetic resonance data. A scan/reconstruction rack (50) includes a scan processor (60) which controls scan parameters and a reconstruction processor (64) and associated hardware for reconstructing received magnetic resonance signals into the image representation. A scan sequencer (52) includes a master microcode board (90) which controls the scan sequencer in accordance with instructions received from the scan processor (60). The scan processor loads a series of codes describing gradient and RF waveform profiles into memories (130) of each of a plurality of profile channels (100, 102, 104, 106, 110, 112, 114). Associated state machines (126) of each channel under control of a clock (138) step the pulse information from the memory (130) to respective output registers. The outputs from four of the channels for controlling the magnetic field gradients are connected to an obliquer (94) which processes the four outputs with a matrix to generate x, y, and z gradient components. The gradient components are connected through digitally controlled pre-emphasis circuits (150) to the gradient coils. The rest of the channels are connected to a frequency synthesizer (116) which provides frequency information for driving the radio frequency coil.

26 Claims, 8 Drawing Sheets

MAGNETIC RESONANCE SCAN SEQUENCER

BACKGROUND OF THE INVENTION

The present invention relates to the magnetic resonance art. It finds particular application in conjunction with medical diagnostic magnetic resonance imaging and will be described with particular reference thereto. However, it is to be appreciated that the present invention will also find application in conjunction with magnetic resonance spectroscopy systems and other applications which require RF and gradient magnetic field sequences.

Heretofore, magnetic resonance imagers have included a superconducting or resistive magnet which generated a temporally constant primary magnetic field. A cylindrical bore extended along a central axis of the magnet such that the primary magnetic field was generated longitudinally along the bore. Gradient magnetic field coils for generating magnetic field gradients across the primary magnetic field were mounted along or as part of the cylindrical bore. A series of gradient amplifiers were connected with the gradient coils for producing high amperage current pulses to drive the gradient coils.

A radio frequency whole body coil was commonly placed within the bore. A digital transmitter was connected with the radio frequency coil to drive the coil with radio frequency pulses for inducing and manipulating magnetic resonance of selected dipoles of a subject within the cylinder. A radio frequency synthesizer was connected with the digital transmitter for providing selected RF waveforms thereto. Magnetic resonance signals emanating from the resonating dipoles of the subject in the bore were received by the whole body RF coil or surface coils and conveyed to a digital receiver.

In order to implement the many available imaging sequences, a general purpose computer was commonly used to control the current amplifiers for the gradient coils, the radio frequency synthesizer, the digital transmitter, and the digital receiver. The general purpose computer also received the magnetic resonance signals from the digital receiver and reconstructed appropriate electronic image representations therefrom. Commonly, the general purpose computer had several analog and digital input and output channels to perform these multiple tasks. More often, the general purpose computer was combined with a timing device which generated timing and sequencing signals which, in turn, were connected to the several analog and digital input and output channels.

Conventional imaging sequences required a large number of precisely clocked signals in a relatively short time interval. This placed very tight timing tolerances on the general purpose computer. In many applications, the timing tolerances were beyond that which could readily be achieved with a moderately priced general computer. When used to generate timing and synchronization for multiple channels, a sequencer device greatly reduced the timing requirements expected of the main computer.

By using a sequencer device, the details of the waveforms at each timing interval could be fed to the gradient amplifiers and the RF synthesizer with rapid, precise timing. The total load on the main computer could be further reduced if the sequencer was preloaded with a series of timing patterns and waveforms relieving the general purpose computer of providing timing pattern and waveform information to the sequencer device in every clock cycle.

Various techniques have been provided for reducing the timing load on the main scan computer. For example, U.S. Pat. No. 4,713,615 of Barratt, U.S. Pat. No. 4,743,851 of Lim, and U.S. Pat. No. 4,710,716 of Keren, describe obliquing techniques which reduce the load on the main computer when the selected slice is angled or obliqued. U.S. Pat. No. 4,845,613 of Netter describes a main sequencer or master microcode which controls several channels. U.S. Pat. No. 4,707,661 of Hoenninger describes a main sequencer microcode which accomplishes long repetitive patterns with less memory by linking pieces which are executed multiple times.

U.S. Pat. No. 5,144,242 of Zielenga provides a detailed example of a sequencer with a specific provision such that the central processing unit can update the program in the sequencer while the sequencer is in operation.

U.S. Pat. No. 4,761,612 of Holland and 4,928,063 of Lampman illustrate dedicated correction circuitry for cancelling eddy current effects.

The present invention relates to techniques and hardware which relaxes the timing requirements and total loading on the main computer through scan sequence automation.

SUMMARY OF THE INVENTION

In accordance with one aspect of the present invention, the scan sequencer consists of a master sequencer device and several waveform channel devices. A main computer processing unit has direct access to memories and registers on the master sequencer device as well as on the waveform channel devices. In operation, the central processor loads a timing program into the master sequencer device and loads several waveforms into a number of the waveform channel generating devices. The central processor initiates the sequence causing two simultaneous sets of actions to occur. The first ongoing set of actions is that the master sequencer sends control and timing signals to the waveform channel devices. Second, the master sequencer sends messages to the central processor to request services and actions such as updates to the waveforms. The master sequencer also notifies the central processor when sampled data is available and that various stages of the scan sequence have been achieved. The CPU performs requested services and acknowledges completion of the services to the master sequencer.

In accordance with a more specific aspect of the present invention, the scan sequencer includes a microprogrammable sequencer supplemented by auxiliary counters for more accurate timing control. A scan time base is controlled totally within the scan sequencer rather than the central processor. The clocking of the microprogrammable sequencer is controlled by the RF synthesizer to achieve exact phase coherence.

In accordance with another more specific aspect of the present invention, the scan sequencer includes a plurality of output state registers and a microprogrammable sequencer engine. The microprogrammable sequencer engine is free to monitor external as well as internal timing signals without explicitly duplicating control information in various alternative control code paths. The output state registers are controllably updated to free the microprogrammable engine from this responsibility.

In accordance with another aspect of the present invention, a first-in, first-out message queue is provided which passes scan related service requests and internal state codes to the central processor. The use of the message queue eases the response time characteristics of the central processor and enables the central processor to receive and process the requests and internal state codes without disrupting the scan timing.

In accordance with another more limited aspect of the present invention, the sequencer tests for the completion of service requests. This insures that the requests have been provided in the time frame allocated by the central processor. In this manner, the control loop is closed, allowing numerous pending requests without adversely impacting the timing.

In accordance with another more limited aspect of the present invention, the scan sequencer timing is interleaved. This allows the CPU to build new scan sequencer programs in the scan sequencer memory without affecting the scan sequence which is currently being run. In this same manner, consecutive portions of extended scans can be built as a prior segment runs, allowing scans of enormous length to be run.

In accordance with another more limited aspect of the present invention, an on-board obliquing means is provided along with more than three logical gradient channels. By providing more logical gradient channels than coordinate directions, complex waveforms can be generated simply by using new scale factors instead of recomputing the entire waveform.

In accordance with another more limited aspect of the present invention, the sequencer includes a multiplicity of profile generation channels. The channels are controlled by the main sequencer microcode such that each channel can be stopped and started independently. The channels are also configured such that conditional execution and conditional branching is supported with appropriate control signals from the sequencer.

In accordance with another more limited aspect of the present invention, the microcode includes multiple sets of gradient scaling or obliquing coefficients. This enables each gradient channel to determine which set of scalars to use in absolute and relative modes. Each gradient channel operates independently of the other channels which enables different updating patterns to be utilized in each.

In accordance with another more limited aspect of the present invention, multiple sets of pre-emphasis circuits are provided. This enables a desired waveform to be sent simultaneously to different gradient subsystems, with each subsystem having a correction applied to it, and each correction chosen to be appropriate for that specific gradient subsystem.

In accordance with another more limited aspect of the present invention, the sequencer sends out messages to the central processor to enable the central processor to track the scan sequence. Some messages inform the CPU that the state of the scan has changed. Others request specific central processor actions. The central processor processes the state information and action requests in order such that the central processor determines that the states have occurred in order. Moreover, the action requests which are interleaved with the state messages can readily be processed because the preceding state message tells the scanner exactly what state the sequencer was in when the action request was made. In this manner, the request can be carried out with the exact knowledge of this state at the time the request was made, even though the central processor may fall several states or messages behind the sequencer.

One advantage of the present invention is that it reduces the burden placed on the scan central processor.

Another advantage of the present invention is that the less burdened central processor has less program complexity. The scan central processor now merely oversees functions which it previously performed.

Another advantage of the present invention is that it enables higher speed scans to be performed. More detailed timing and switching sequences can be performed with a finer time granularity.

Another advantage of the present invention is that artifacts are reduced.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
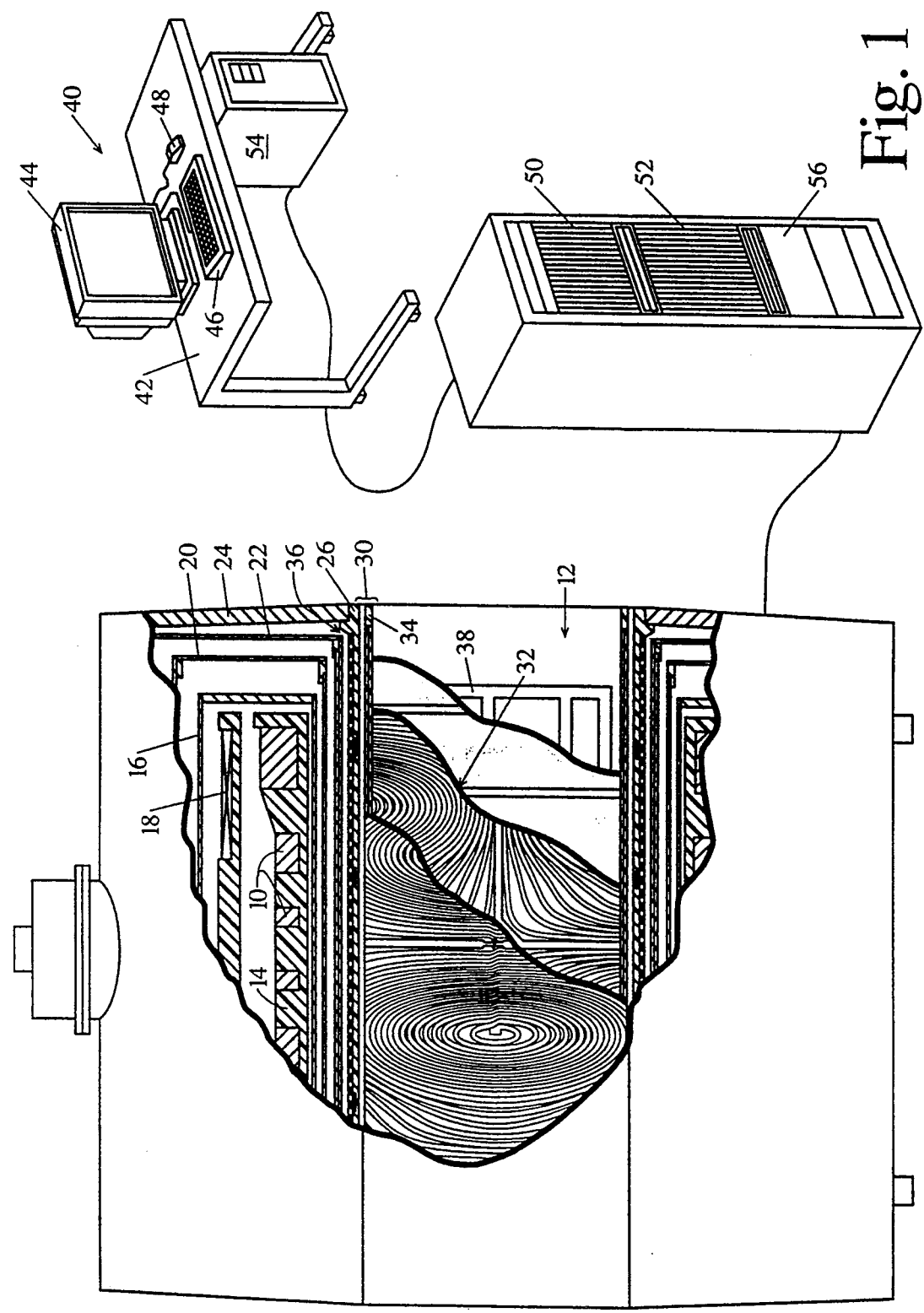
FIG. 1 is a diagrammatic illustration of a magnetic resonance imaging system in accordance with the present invention.

With reference to FIG. 1, a plurality of primary magnet coils 10 generate a temporally constant primary magnetic field along a longitudinal or z-axis of a central bore 12. In a preferred superconducting embodiment, the coils 10 are supported by a former 14 and received in a toroidal helium vessel or can 16. The vessel 16 is filled with liquid helium to maintain the magnetic field coils 10 at a temperature at which it is superconducting under the applied magnetic fields. Preferably, a magnetic field shield coil 18 generates a magnetic field which combines with the field coil 10 in the bore 12 to create the primary field and which substantially cancels the main magnetic field in regions surrounding the superconducting magnet.

To reduce helium boil-off, the toroidal helium vessel 16 is surrounded by a first cold shield 20 which is maintained at about 20° K. or less. A second cold shield assembly 22, chilled to about 60°–70° K. or less, surrounds the first cold shield assembly. A toroidal vacuum vessel 24 encases the cold shields to define a vacuum reservoir. The vacuum vessel 24 includes a nonferrous cylindrical member 26 that defines the bore 12 and extends parallel to the z-axis.

A gradient coil assembly 30 including x, y, and z-gradient coils is mounted along the bore. Preferably, the gradient coil assembly is a self-shielded gradient coil that includes a primary x, y, and z-gradient coil assembly 32 that is potted to a dielectric former 34 and a secondary coil assembly 36 that is supported by the cylinder 26 on a second former. Inside the gradient coil assembly 30, a whole body RF coil 38 is mounted. Optionally, surface coils, not shown, may also be provided. The surface coils may be used in conjunction with the whole body coil 38 to receive radio frequency magnetic resonance signals from resonance induced by excitation and manipulation RF signals from the whole body coil or may be used in both transmit and receive mode.

An operator interface and control station 40 includes a work desk assembly 42, a human-readable display such as a video monitor 44, and an operator input means including a keyboard 46 and a mouse 48.

Figure 2:
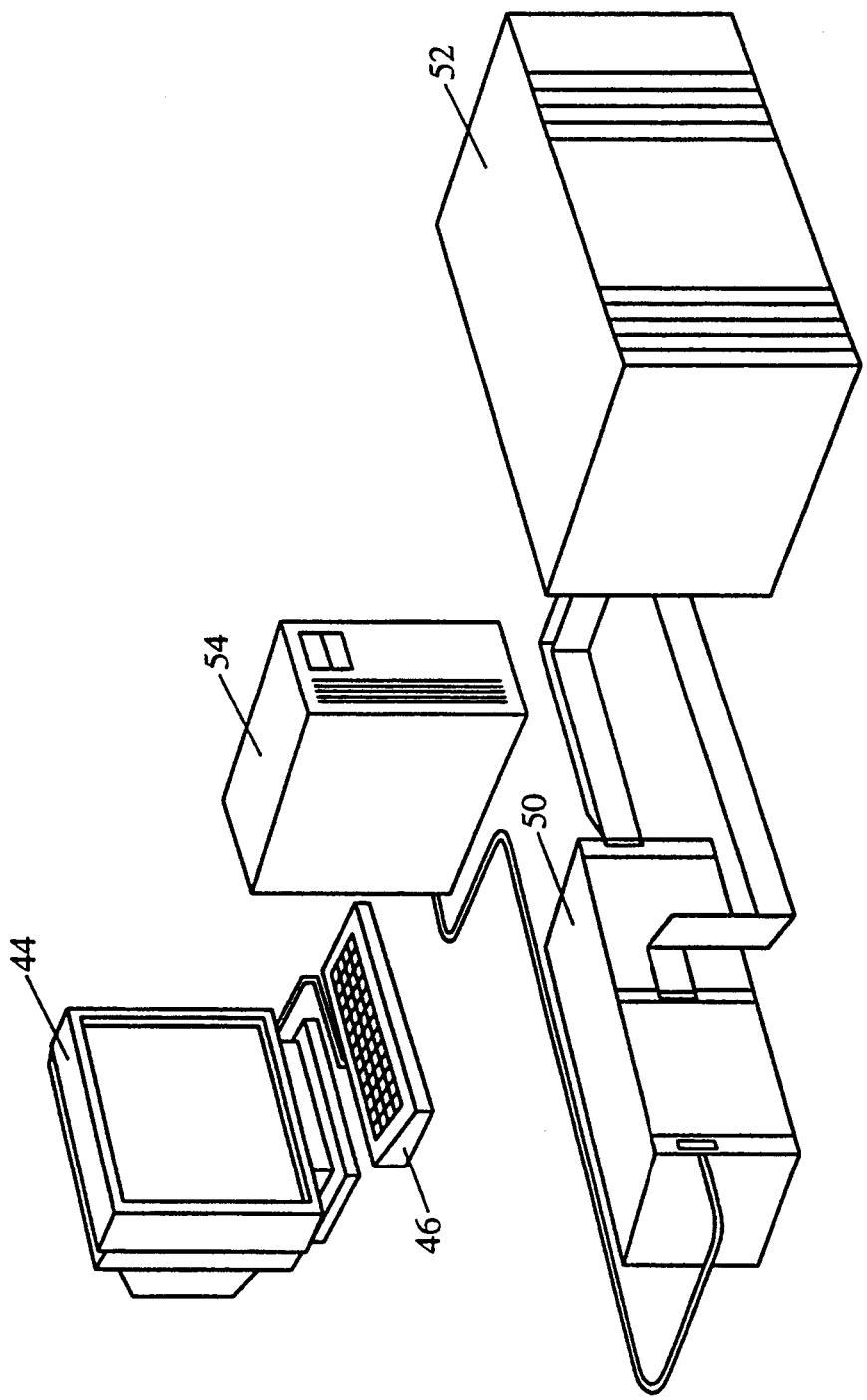
FIG. 2 is an expanded illustration of the components of the control system of FIG. 1.
Figure 3:
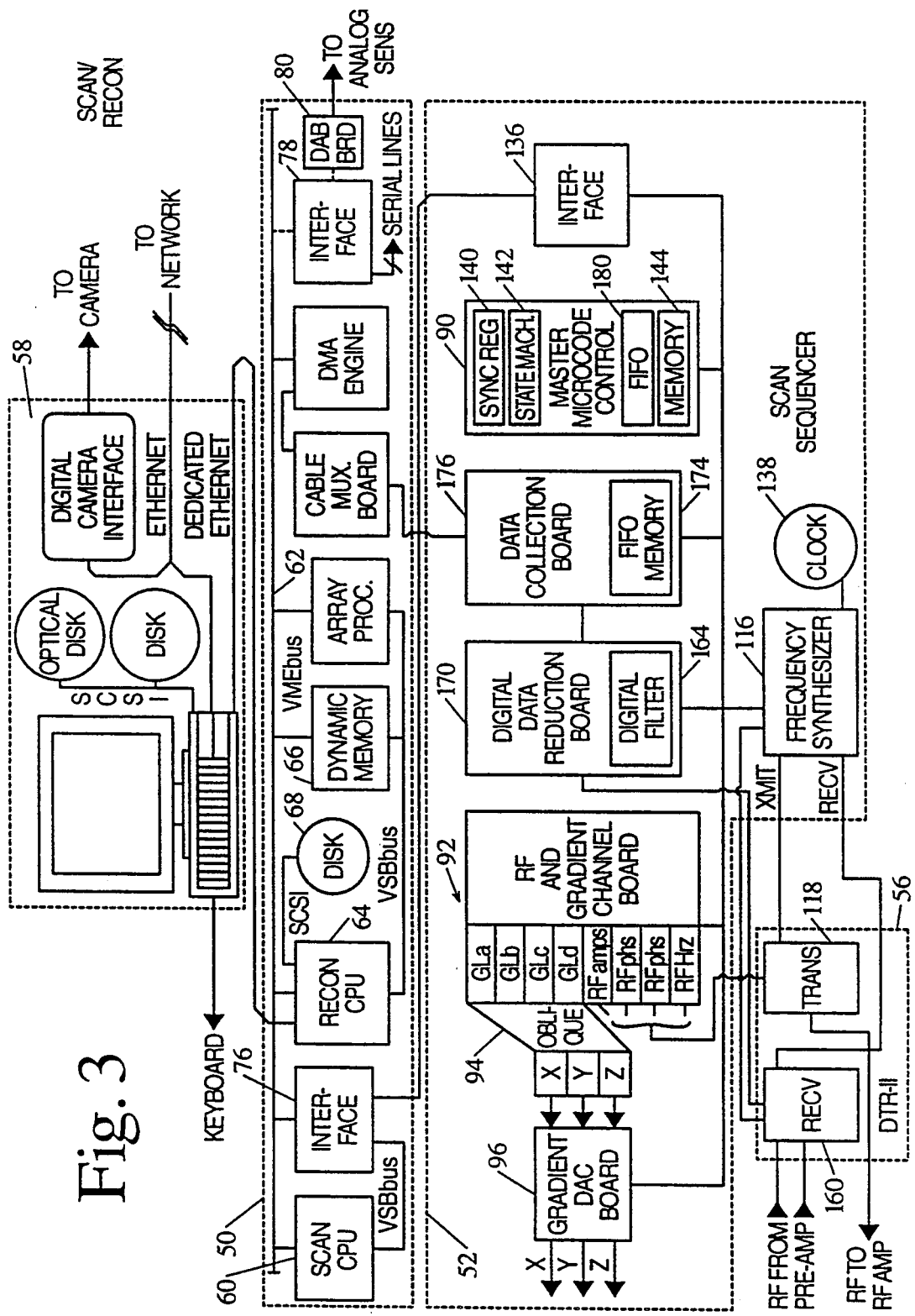
FIG. 3 is a more detailed diagrammatic illustration of the components of the control system of FIGS. 1 and 2.

With continuing reference to FIG. 1 and further reference to FIGS. 2 and 3, processing hardware is mounted in a scan reconstruction rack 50, a scan sequencer rack 52, a peripheral expansion box 54, a digital transmitter and receiver 56, and a display system 58. The display system under the control of the keyboard and mouse produces human readable displays. Suitable workstation computers include any of many commercially available computers, preferably a RISC computer with UNIX software. Typically, a 1280×1024 video resolution format is provided as well as an SCSI channel to handle peripherals and ETHERNET TM as the network interface.

With particular reference to FIG. 3, the scan/reconstruction subsystem 50 includes a scan central processing unit 60 which is connected by a VME bus 62 with numerous support hardware boards. A reconstruction central processor 64 reconstructs the received magnetic resonance signals into an image representation for display by the display system 58. A dynamic memory 66 and disk memory 68 provide for magnetic resonance signal data and image storage. An array processor 70 is used to accelerate the speed with which the received image data is reconstructed. A direct memory access (DMA) engine 72 is connected between the VME bus 62 and a cable multiplexer board 74. The multiplexer board 74 and a VSB interface 76 both interconnect with the scan sequencer 52. The multiplexer board 74 is an interface which receives the massive amounts of magnetic resonance signal data generated during a magnetic resonance scan, which magnetic resonance signal data is fed to the reconstruction central processor 64 or memory 66, or array processor 70 by the DMA engine 72. The interface 76 provides communication between the scan central processor 60 and the scan sequencer means 52. The interface 76 primarily passes control information to the scan sequencer means 52. The interface 76 conveys instructions in one direction and receive acknowledgements and status reports in the other. The interface 76 maps the scan sequencer means 52 into the VSB bus address space of the scan central processor 60. Optionally, another interface board 78 and an analog-to-digital converter 80 provide communication with serial peripherals and power supply status monitoring.

The scan sequencer means 52 contains the hardware which manipulates the radio frequency transmitter/receiver 56 and the gradient waveforms in order to provide the RF and magnetic gradient states in the target object for the selected sequence. The scan sequencer hardware includes a master microcode control channel means 90, a logical gradient and RF profile channel means 92, an obliquing engine means 94, and a physical gradient pre-emphasis means 96.

The logical gradient and RF profile channel means 92 includes a plurality of profile channels. A profile channel is a state machine controlled by instructions and delay values which it reads from a dedicated memory. Within each profile channel, the associated state machine performs three principle tasks: (1) reading an instruction which it will direct to a given output value (the profile) for a given clock count, (2) branching, and (3) halting. The master microcode means 90 includes a master microcode control board which controls the scan timing by manipulating the independent profile channels.

Figure 4:
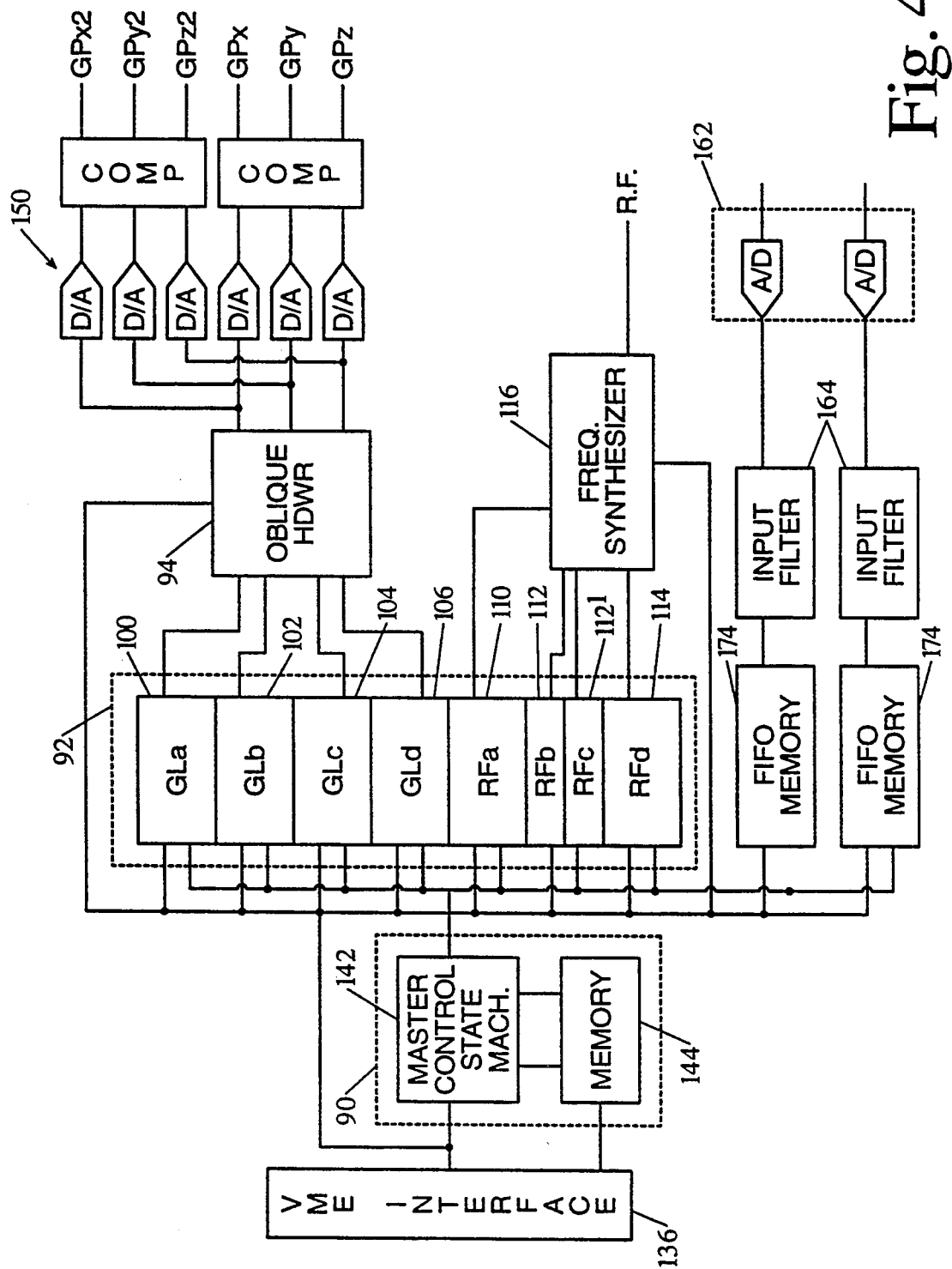
FIG. 4 is a more detailed diagrammatic illustration illustrating internal workings of the gradient channel board and associated obliquing and output hardware, the radio frequency transmitter, and the digital receiver of FIG. 3.

With particular reference to FIG. 4, the preferred embodiment includes eight profile channels, all of identical design. There are four logical gradient profile channels 100, 102, 104, and 106 which are connected with the obliquing engine means 94. Similarly, there are four RF profile channels: channel 110 for radio frequency signal amplitude, two channels 112 for radio frequency signal transmit and receive phase, and a channel 114 for frequency which are conveyed to digital frequency synthesizers 116. The output of the digital frequency synthesizer is conveyed to a digital transmitter 118 in the digital transmit/receive device 56. The digital transmitter 118 applies electrical currents to the RF power amplifier and the RF transmitting coil such that it transmits the selected RF signal into the examination region. Optionally, additional channels may be provided for controlling a second digital transmitter, or the like.

Optionally, NMR signals might be received from several coils (as is often called "NMR phased array"), by replicating the functional units to receive and digitize the data. As an example not shown in FIG. 3, four complete receive chains would be implemented in the preferred implementation by using four receiver boards 160, four frequency synthesizers 116, and four digital data reduction units 170. The data collection board and data FIFOs 176 then serve as a way to multiplex the multiple channels together onto one data pathway.

The gradient waveforms typically consist of several functional portions. Individual portions include simple waveshapes such as trapezoidal or sinusoidal segments. It is common that when scanning, some of these functional shapes are modified or updated while others remain constant over several iterations. For example, gradient waveshapes such as a slice selection waveform remain constant, while gradient waveshapes such as a phase encoding lobe have their amplitudes rescaled in each iteration.

The functional waveshape portions often overlap temporally and are combined, e.g. by addition, before being presented to the gradient current supply amplifiers. The operation of adding together waveforms and providing amplitude scaling of waveforms is known from prior implementations.

Previously, three gradient waveform inputs, e.g. x, y, and z, were scaled and coadded in order to generate three outputs, generally referred to as obliquing. This operation represents a matrix multiplication, a linear transformation, and corresponds to generating images or data sets with arbitrary tilts and rotations with respect to the physical magnet axis. The present invention reduces requirements of the scan central processor 60 by providing for more than three gradient waveform channels, i.e. more channels than physical axes. In particular, the present preferred embodiment provides for four gradient waveform channels that can be scaled and coadded. The use of four channels is advantageous when functional waveform sections overlap. The scan central processor 60 need only modify the section which changes. It need not combine the rescaled portion with the other portions. The profile channels become "logical" channels which can be assigned to the physical axis of the magnet arbitrarily through the matrix of scaling coefficients.

Figure 6:
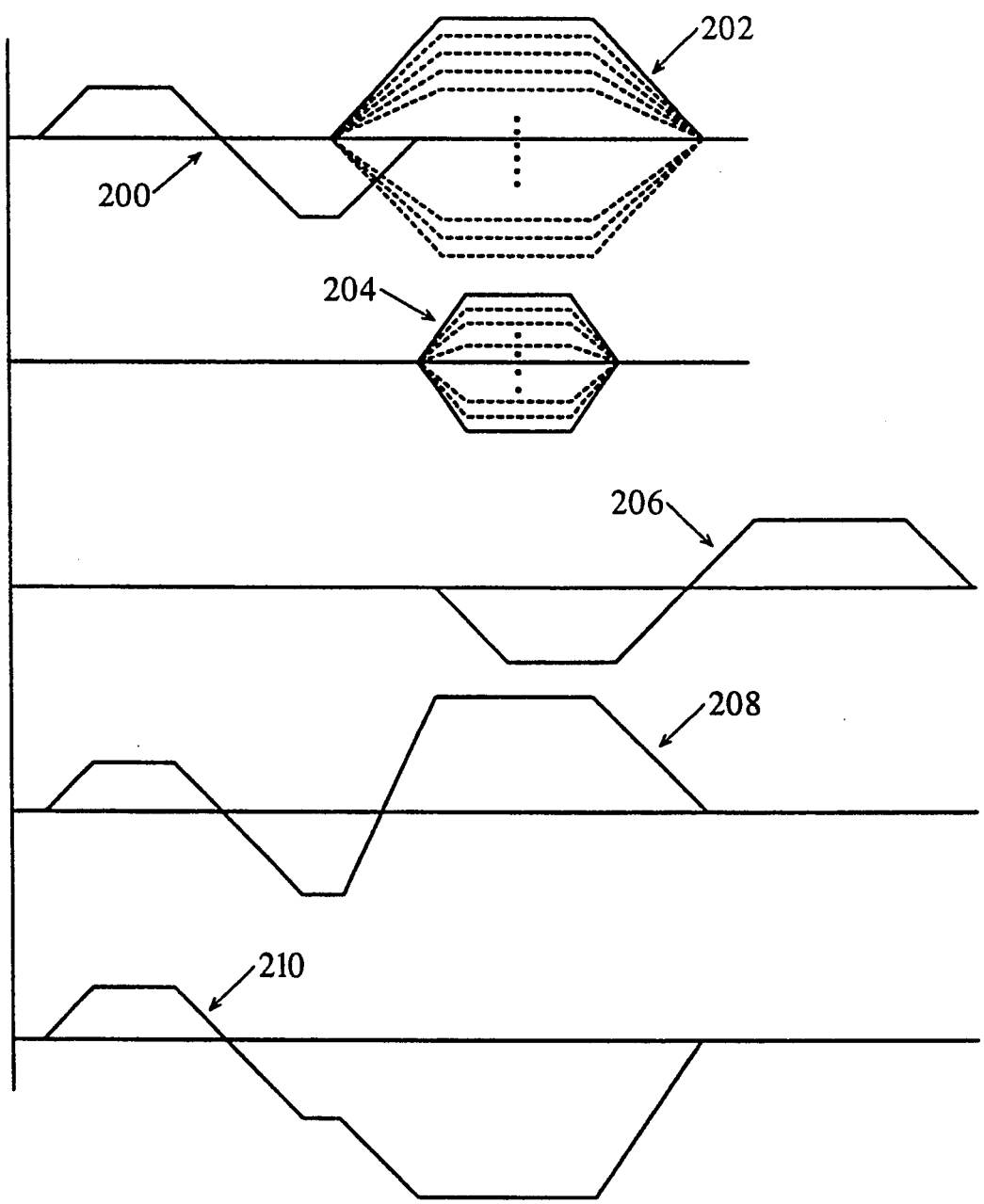
FIG. 6 is a diagrammatic illustration of a complex gradient waveform, generated as a combination of simpler overlapping gradient waveforms.

With particular reference to FIG. 6, consider an exemplary sequence in which complex gradient waveforms are generated. In a typical three-dimensional Fourier transform imaging sequence, there are three gradient axes: a slice selection gradient waveform 200, 202, a phase encode gradient axis 204, and a frequency readout axis 206. The slice selection gradient axis requires that in various repetitions of the sequence, various combined waveforms must be generated. Combined waveforms 208 and 210 represent just a few of the numerous combined waveforms to be generated and output to the slice selection axis.

One exemplary way of generating such waveforms would be to store waveform portions 200 and 202 in distinct logical gradient channels, e.g. 104 and 106. Waveforms 204 and 206 could be stored in other gradient channels 100 and 102 as is customary in prior implementations.

By way of example, consider a constant slice selection portion 200 of a gradient which partially overlaps a phase encoding portion 202. The scan central processor 60 simply provides a scaling coefficient which is applied only to the phase encode section. In the prior art, since both waveforms had to be held in a single waveform channel, the scan central processor would be required to perform a more complicated function of scaling the amplitudes of one functional waveshape adding to the constant functional waveshape and reloading the whole newly created waveshape into the waveshape channel device.

Another kind of programming advantage and increase of efficiency is derived from this technique where overlapping waveforms are added. With the prior art, it was common to define waveforms as a set of values each being maintained for what may be different durations. For example, a section of a waveform which represents an increasing ramp might have been defined by an amplitude point every few microseconds. However, a constant amplitude section might have been defined by a single value entered once in the channel with a much longer duration in microseconds. Coadding distinct waveshapes becomes a much more difficult operation when the waveshapes are not defined with simultaneous clocking of the data points. The computer must generate a single stream of data values, normally with an algorithm such as to find a new output value whenever any of the coadded waveforms undergo a transition. With the present technique, the waveforms are added consistently by allowing the obliquer 94 to scale and add all waveforms regardless of how many of the component waveforms might have undergone transition or updates.

In the preferred embodiment, the obliquer 94 performs the matrix operation once per major clock cycle of the sequencer (i.e. every microsecond), and the output physical gradient amplitudes are freshly calculated from the logical gradient amplitudes. This is done without concern as to whether or not the logical amplitudes have undergone transitions from the amplitudes at the previous clock cycle.

It is to be appreciated that any number of gradient logical channels may be chosen. Providing successively more logical channels (e.g. beyond four) increases the complexity of waveforms which may be combined within the sequencer, and simplifies the programming issue of which gradient waveform components to allocate to which logical channel. There is, of course, the disadvantage of a higher cost of physical construction.

Figure 5:
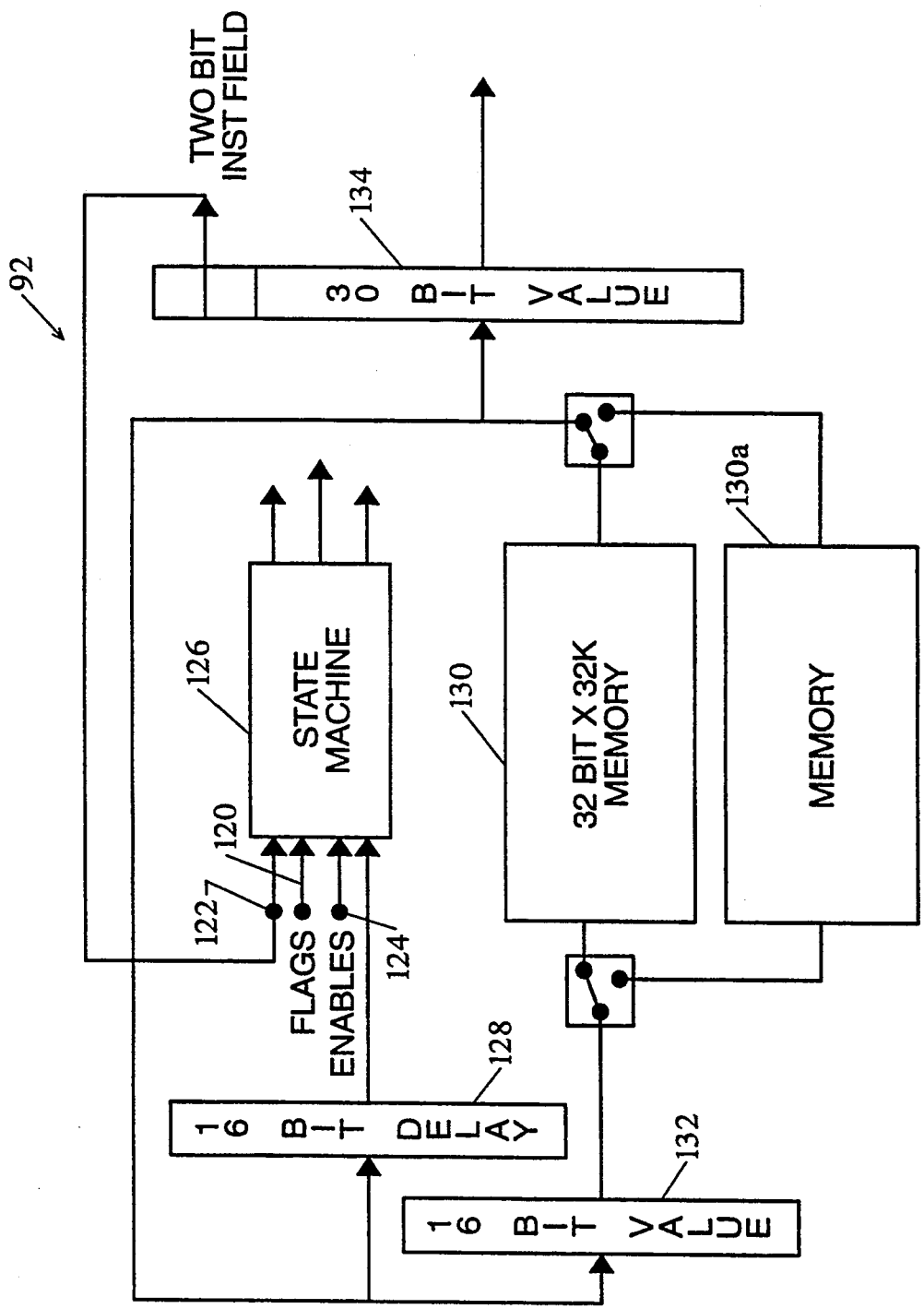
FIG. 5 is a diagrammatic illustration of a typical channel sequencer.

With particular reference to FIG. 5, each of these eight channels is controlled by code input from the master microcode board 90. The three code inputs includes two branch flags 120 and an enable 124. The branch flags 120 include one branch flag seen only by the given channel, and a second branch flag which is bussed such that all channels see it simultaneously. A branch control information field 122 is also an input to the state machine 126. Received code, preferably 64-bits stored as two 32-bit items, includes gradient profile or RF information, preferably a 30-bit field, and control information 122 (preferably 2-bits), and delay information (preferably a 16-bits), and a branch address, (preferably 16-bits). A first delay counter 128, preferably a 16-bit delay counter, receives the delay field and enables the value to be presented to the state machine for between 1 and $2^{16}$ clock cycles, i.e. about 1 microsecond to about 65 milliseconds, in the preferred embodiment. Each channel has a RAM memory 130 for storing amplitude and delay count information. A buffer 132, preferably a 16-bit buffer, temporarily holds the corresponding gradient or RF address information. An output buffer 134, preferably a 32-bit buffer, provides a larger output signal which includes the bits of the output signal (preferably 16-bits for the gradient waveform amplitude) and a plurality of bits, e.g. a 14-bit marker, which specifies which one of a plurality of sets of obliquing matrix coefficients are to be used in an obliquing process. The output buffer also includes a 2-bit instruction field which is conveyed to the channel control information input 122 of the state machine 126. The RF channels, of course, do not use an obliquing matrix. Accordingly, each of the RF outputs is resolved to a higher number of bits, e.g. 30 bits.

The channels halt when the delay field which accompanies an instruction word field or pair is found to be zero. For the four logical gradient channels 100, 102, 104, 106 when the channel halts, the channel profile value lines are also zeroed. Functionally, this is equivalent to removal of the enable input, disabling the channel.

With reference to FIGS. 3, 4, and 5, in operation, the scan central processor 60 transfers all the necessary information through interface 76 and an interface 136 to the master microcode means 90 and memories 130 of the profile channels 100, 102, 104, 106, 110, 112, and 114. Thereafter, the entire scan can be and is run without further intervention by the scan central processor. A clock source 138 of the frequency synthesizer 116 controls not only the frequency synthesizer 116 but all timing of the scan sequencer means 52, preferably with a 1 microsecond level of programming granularity. Because the scan central processor 60 is not controlling the immediate details of the ongoing scan, it is free for other tasks, such as monitoring the ongoing scan to be sure that all is in order. One of the tasks which can be conducted is to load the next scan sequence into a memory 130a of each of the channels 100, 102, 104, 106, 110, 112, and 114. For longer scans, the next portion of a scan can be loaded into one of the memories 130, 130a while the other is controlling the channel. In this manner, scans of any length, and theoretically infinite length, are generated.

The memory 130 can be updated by the scan central processor 60. The memory is updatable without disrupting the operations of the sequencer. Rather than providing a separate register 130a, the memory 130 is preferably a dual-ported semiconductor memory. An interleaved access timing procedure is used. More specifically, the scanner is run with major clock cycles of one microsecond. In every one microsecond major cycle, a few subcycles totalling a few hundred nanoseconds are allocated to read or write accesses from the scan central processor 60. The remainder of the major cycle, several hundred nanoseconds, is allocated to accesses by the scan sequencer means. With this interleaved access timing allocation, the scan central processor 60 is guaranteed a steady rate of access to the channel memories and registers of the sequencer. Yet, the profile channels are guaranteed to be able to run at synchronous rates and produce consistent output timings regardless of the level of scan central processor access.

The master microcode means 90 controls all eight of the profile channels. More specifically, the master microcode means includes a portion which functions as a more sophisticated state machine 142 than the state machines 126 of the individual channels. The master microcode means state machine 142, clocked by the synthesizer clock 138, sequences through instructions which are held in a memory 144 also on the board. Some of the bits of each word operate the state machine 142 and other bits service the profile channels. In the preferred embodiment, the memory 144 is a 64-bit×32K memory to facilitate sequencing 64-bit words. 32-bits operate the state machine and 32-bits service the profile channels.

In the preferred embodiment, portions of the state machine 142 can be implemented by using a commercially available microsequencer device, such as the Am29C331 device produced by Advanced Micro Devices. In the preferred embodiment, portions of the 32-bit state machine word are used as control inputs to the Am29C331, such as a 6-bit field being supplied to the instruction code input of the Am29C331. In the preferred embodiment, the state machine is clocked once per major cycle, i.e. the clock pulse to the Am29C331 is strobed once per microsecond. Thus, in the preferred embodiment, the state machine 142 advances in a manner such that it remains synchronous with the operation of all of the channel state machines 126.

The memory 144 further provides programming memory space. The master microcode board also provides internal event flags, extra timers, a software interlock registration, and a hardware interrupt queue. The memory 144 can be accessed by the scan central processor 60 through the interface 76.

A synchronization flag register 140 of the master microcode means 90 stores flags which indicate the completion of service actions. More specifically, when the scan central processor 60 performs a requested service action for one or more of the channels, it sets a flag in the register 140 upon completion. As the state machine 142 steps through the sequences, it checks for corresponding flags. If the flag is present indicating an appropriate update, the state machine 142 proceeds. If the flag is missing, the state machine branches into a shut down mode. That is, if the flag is present indicating that the service, such as an update of the channel waveform, was provided within the service window, then the state machine continues. If the flag is missing indicating that the service was not provided within the window, then the state machine branches or switches to a line of code which shuts down the magnetic resonance sequence being executed in a timely and orderly way or as may be otherwise indicated by an error routine. The flag is cleared after a successful test for its presence as the sequence continues.

Each of the channels runs independently of the scan central processor. The sequence information is changed at random times by the scan processor. In particular, setting a few conditions or a single condition in the main microcode of the master microcode means 90 alters the pattern of the scan. The scan central processor itself need not modify the individual channels directly. Without this control of the channels from the master microcode means 90, the scan processor 60 would need to perform the difficult task of guaranteeing that the several independent updates all take effect at the same time.

There are numerous examples of a single condition which might alter the desired output of the multiple channels. First, some scans must wait or pause until an external event occurs, such as a cardiac gated scan sequence. Other scans acquire tuning data or calibration information until a preselected condition, such as a degree of accuracy, is achieved. The scan then proceeds with the main portion of the data acquisition. Other scans loop indefinitely, maintaining a dynamic equilibrium in the magnetic resonance signal until an event such as an action by the operator, triggers the main data acquisition. When scans are terminated, either intentionally or in response to a detected problem, multiple gradients must be shut down smoothly without presenting discontinuous waveshapes to the amplifiers. The master microcode means 90 generates control signals which alter the control of the individual channels or multiple channels. In the preferred embodiment, the microcode word has special bits in it which the various channels can test. The channels are programmed to branch or not branch, depending on whether an appropriate bit in the microcode is set. This enables the sequence to continue as before or branch into a preselected shutdown routine for that channel.

The obliquing engine 94 includes three sets of hardware which enable the engine to mix four logical gradient channels $A_i$, $B_j$, $C_k$, $D_n$ down to three physical gradient drive sources $P_x$, $P_y$, $P_z$. More specifically:

$$\begin{bmatrix} P_x \\ P_y \\ P_z \end{bmatrix} = \begin{bmatrix} C_{xi} & C_{xj} & C_{xk} & C_{xn} \\ C_{yi} & C_{yj} & C_{yk} & C_{yn} \\ C_{zi} & C_{zj} & C_{zk} & C_{zn} \end{bmatrix} \times \begin{bmatrix} A_i \\ B_j \\ C_k \\ D_n \end{bmatrix} + \begin{bmatrix} O_x \\ O_y \\ O_z \end{bmatrix}, \quad (1)$$

where C are the coefficients of the transform matrix and O are gradient offsets. The transform matrix coefficient are dependent on the indices of the logical gradient channels A, B, C, D, representing a functional dependence of the twelve of the fourteen marker bits which are carried along with each logical gradient channel value field. That is, for each obliquing operation, i.e. each clock cycle, the A logical gradient channel can be used to select the "i" column of the coefficients while the B logical gradient channel selects the "j" column of the coefficient, etc. In every step, one of 4096 different i, j, k, and n columns containing three coefficients C is selectable. In addition to this, the master microcode means 90 has a bank select bit which forces a change between selecting from one group of obliquing coefficients C and an alternate group of coefficients. More specifically, the gradient profile channels specify one of a plurality of register locations which is to be used as a pointer into a coefficient memory for storing the sets of coefficients C. With this arrangement, a larger portion of a scan is completely predetermined within the coding of the scan sequencer. Self-modification of the choice of coefficients without the scan processor intervening is thus provided.

Using multiple sets of the obliquing coefficients C independently in each of the gradient channels eases the programming burden, particularly in situations in which different gradient waveforms undergo different patterns of updating.

By way of example, consider multiple oblique slices are being scanned in a fixed cyclical sequence with the phase encode gradient being updated in a complicated manner based upon a real time input such as the patient's heart beat or respiration. In this example, some of the gradient waveshapes such as the slice select gradient can be implemented with a single stored waveform which, at each repetition, increments the register to its scaling coefficient. No scan processor updates or actions are needed to perform this gradient. Simultaneously, the algorithm running in the scan central processor can determine an optimal update strategy for the phase encode gradient. In this manner, the scan central processor can take an action to alter subsequent phase encode gradient amplitude without taking into account the current state of the other gradients.

The pre-emphasis means 96 enables the x, y, and z-outputs of the obliquing engine 94 to be adjusted with a plurality of pre-emphasis time constants to correct for eddy currents. Suitable pre-emphasis correction circuitry is illustrated in U.S. Pat. No. 4,761,612. The pre-emphasis circuitry yields images with fewer artifacts or imperfections by generating more accurate and effective waveforms within the magnet. The shaping of gradient waveforms is routinely performed to compensate for temporal distortion relative to ideal waveshapes. A primary source of distortion is eddy currents induced in the magnet or other conductive structures. The eddy currents tend to counteract the higher frequency components of the gradient waveforms.

In the preferred embodiment, each of the three physical axes has four available time constants each of which can be set in four ranges so that the effective time constant can be varied over a range of about 256 to 1. The time constants are implemented with multiplying digital-to-analog converters 150. That is, for each axis, there are four analog filtering sections, each of which is controlled as to its range of time constants ($T_0$), it time constant within that range ($T_c$), and its amplitude of overshoot or undershoot ($O_v$). The time constant $T_c$ is selected by a digital word, preferably a 12-bit amplitude portion and 2-bit range selection field, according to the following formula:

$$T_c = \frac{T_0}{1 - n/4096}, \quad (2)$$

where $T_0$ is an initial range value and n is the value of the 12-bit amplitude portion. The amplitude of the overshoot $O_v$ in percent is determined by another 12-bit word:

$$O_v = (150 \times m/4096) - 50 \quad (3)$$

where $m = 0, 1, 2, \ldots, 4095$. By controlling each filtering section to be selectable between four ranges of time constants, each section can be implemented with a higher degree of control precision, and with less analog noise over a wide range of time constants than if a single-range implementation of a filter circuit were required to operate over an extremely wide range of time constants.

The pre-emphasis circuits allow independent shaping of the gradient waveforms in each case of non-uniform eddy current characteristics. For example, a gradient coil physically consists of several opposed symmetrical windings of the conductor. Due to the mechanical tolerances, these windings may exhibit differing geometric properties to the magnet structure in which the eddy currents are generated. Hence, the symmetrically opposed eddy current structures may have different eddy currents in them, such as variations in amplitude. By using multiple sets of pre-emphasis circuits 150, each of which is individually programmable, opposed portions of the gradient coils can be driven with the same fundamental gradient waveform but with different eddy current compensations. This allows for more exact cancellation of the eddy currents in the various structures.

Another use for the multiple programmable pre-emphasis circuits is in conjunction with special purpose gradients. In some sequences, two or more fundamentally different coil windings are driven with a common waveshape, e.g. a surface and whole body coil or two different surface coils. Similarly, the shields of self-shielded gradient coils can be driven with related, but slightly different eddy current compensations than the primary gradient coil.

The transmitter/receiver device 56 includes a receiver card 160 which digitizes the received RF magnetic resonance signal. The receiver board 160 contains an analog-to-digital converter 162 for each received signal channel. The receiver card shifts the analog input signal from a receive band set by the synthesizer frequency, to a band centered about the intermediate frequency 500 kHz. This intermediate frequency signal is converted to digital data at a fixed sampling rate of 2 megasamples per second, preferably 14 bits per sample, by the analog-to-digital converter 162. The timing window during which conversion and sampling occurs is controlled by the master microcode means 90.

The digitized received signal is fed from each analog-to-digital converter to a digital filtering means 164 located on a digital data reduction portion board 170. Under normal usage, the digital filters perform multiple functions upon the received digital signal, including generation of quadrature signal (complex signal), demodulation from 500 kHz to baseband, lowpass filtering, and decimation of the sampling rate. The digital filters 164 are programmable, and support a wide range of filter functions and decimation rates. Preferably, the filters are two-stage digital filters. The first stage is an integration/decimator/comb filter which provides coarse lowpass filtering. This stage decimates its output rates at factors of about 1 to 1024, preferably. The second stage is an FIR filter which implements sharp filter profiles with low decimation rates, preferably of 1 to 16 bits, and generates 24-bit output data values. In the preferred embodiment, implementing the digital filters may be done using the HSP43220 decimating filter chip, commercially available from Harris Corp.

Preferably, the filter functions have the following characteristics:

$$F_{bp} = 1/(4 \times SR_{2xNqu}) \quad (4a)$$

$$F_{sb} = 2F_{bp} \quad (4b)$$

$$At_{pb} = 0.2 \text{ db} \quad (4c)$$

$$At_{sb} = 80 \text{ db} \quad (4d)$$

where $F_{bp}$ is a bandpass frequency, $F_{sb}$ is a stopband frequency, $SR_{2xNyq}$ is an output data rate, $At_{pb}$ is a maximum bandpass attenuation, and $At_{sb}$ is a minimum stopband attenuation.

The data from each of the digital filters 164 is conveyed to a corresponding first-in, first-out memory means 174 on a data collection board 176. The first-in, first-out memory buffers receive data corresponding to each receive channel, which the data collection board 176 conveys to the interface board 74 of the scan/reconstruction means 50. The DMA engine 72 conveys the data to the reconstruction processor 64 for reconstruction into a digital electronic image representation. Alternately, portions or all of the acquired data may be transferred from the DMA engine 72 to the array processor 70, or to the dynamic memory 66.

The microprogrammable engine or state machine 142 monitors external as well as internal timing signals without expressly duplicating control information in various alternative control code paths. This simplifies the programming. In particular, when a series of instructions are used in a sequence and when it is used in many different sequences, a single copy of the series of instructions is generated and used in all cases, regardless of which control signals are needed at the waveform channels. Commonly used examples of such sequences include the sequences for (1) testing for possible termination or abort conditions, (2) resetting an initializing counters and branching addresses associated with a finite loop, and (3) testing for an external event such as a cardiac R-wave and notifying the scan central processor 60 whether such an event has occurred at or before exact times in the scan sequence. These and other commonly used operations occur at different times in the sequence. At the time when each occurs, different waveform channels may be active. For example, an RF pulse may or may not be active and the gradient phase encoding pulse may or may not be active. This feature allows commonly used series of operations to be performed with the exact same microcode commands independent of whether any given channel waveform happens to be active or inactive.

The internal state codes and service requests are generated at the master microcode 90, and are stored into a FIFO memory queue 180. They remain there until the scan processor 60 reads them, at which time the state codes and service requests are transferred through the interface means 136 and the interface means 76 to the scan central processor 60. The use of the FIFO message queue 180 relaxes the timing requirements on the scan central processor 60. In many cases, the FIFO message queue 180 extends the duration of the window within which the scan central processor can respond and simplifies the generation of scan sequence programs. Because both the internal state codes and the service requests are stored in order in the FIFO message queue 180, the state of the scan at the time of each service request is made known to the scan central processor. This enables the scan central processor to formulate an appropriate response even when the scan sequencer means 52 has gone on to later states. Some of the service functions required by the scan central processor include altering the phase encode gradient waveforms, altering a frequency offset waveform, unloading acquired raw data, and the like. In the preferred embodiment, these actions have associated timing windows. If the scan central processor 60 services the action at any time in the window, the scan proceeds correctly. If two or more of these windows overlap in time, a mechanism, such as a single interrupt line without queuing is used by the scan sequencer means 52 to request services from this scan processor 60. The scan processor 60 receives the requests of a more urgent nature that are to be fulfilled before the beginning of the next request window through the single interrupt line to prevent multiple pending service requests from being lost.

The hardware FIFO message queue 180 removes the constraint that one request would have to be serviced before another unrelated request window occurs. Queuing of the service requests allows other parts of the hardware to support the queuing more effectively. For example, when data sampling mechanisms buffer and queue multiple lines of sample data, the control information associated with the availability of data is stored elsewhere in the system. If queuing of the control information had to be done by the scan central processor, some of the advantages of the sampling hardware being able to queue data independently would be lost. Without queuing of the control information in the FIFO message queue 180, the scan central processor 60 would need to respond more often and with much shorter latencies.

Without the FIFO queue 180, successive requests would have to be generated within time intervals between which there could be no shorter than some minimum guaranteed software response time. Queuing eliminates this minimum interval between requests and permits a request to be programmed into the sequence whenever it is acceptable for the scan central processor to begin the service. This eliminates the need for the software to take into consideration the timing with which unrelated requests might occur to prevent interference.

Without the FIFO memory means 180, there can be real time and synchronization difficulties between the sequencer means 52 and the scan central processor 60. For example, when the scan is looping through several slices and several phase encode amplitudes, the sequencer can cause slice offsets to be altered without CPU intervention. In a sequence in which the phase encode gradient update algorithm requires scan central processor interaction, the scan central processor 60 responds to a phase encode gradient request. However, the CPU will need to determine which slice is being scanned. The current slice number is commonly a part of scan state information. The scan central processor 60 can try to read this information from the scanner means 52, but the slice number may already have changed.

The FIFO memory 180 enables the scan processor to process all update requests and all state transition information in the order they are generated. This guarantees that the state of the scanner is fully determined corresponding to the times at which the requests were issued.

Figure 7:
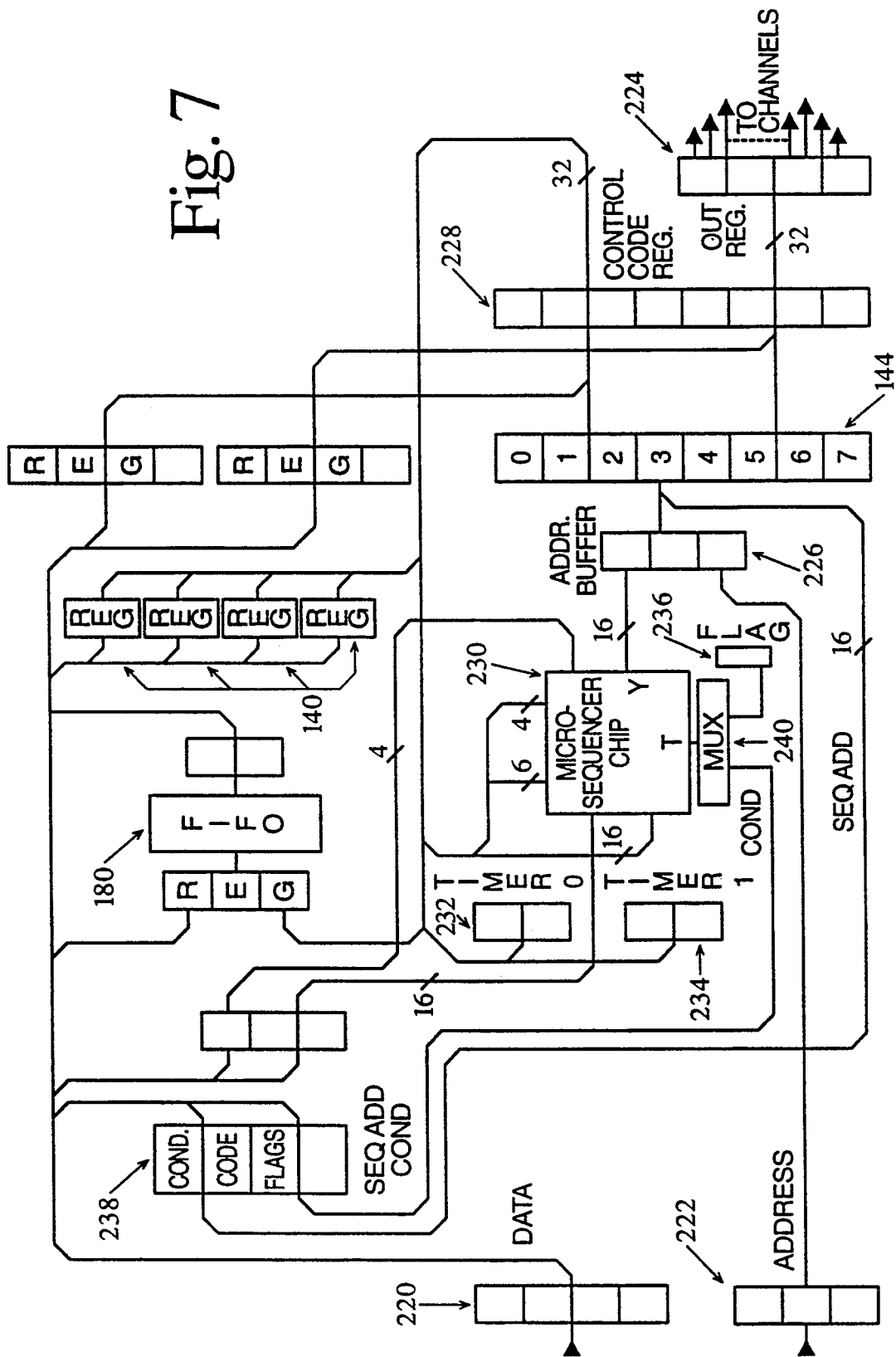
FIG. 7 is a more detailed diagrammatic description of the master microcode board portion of the sequencer.
Figure 8:
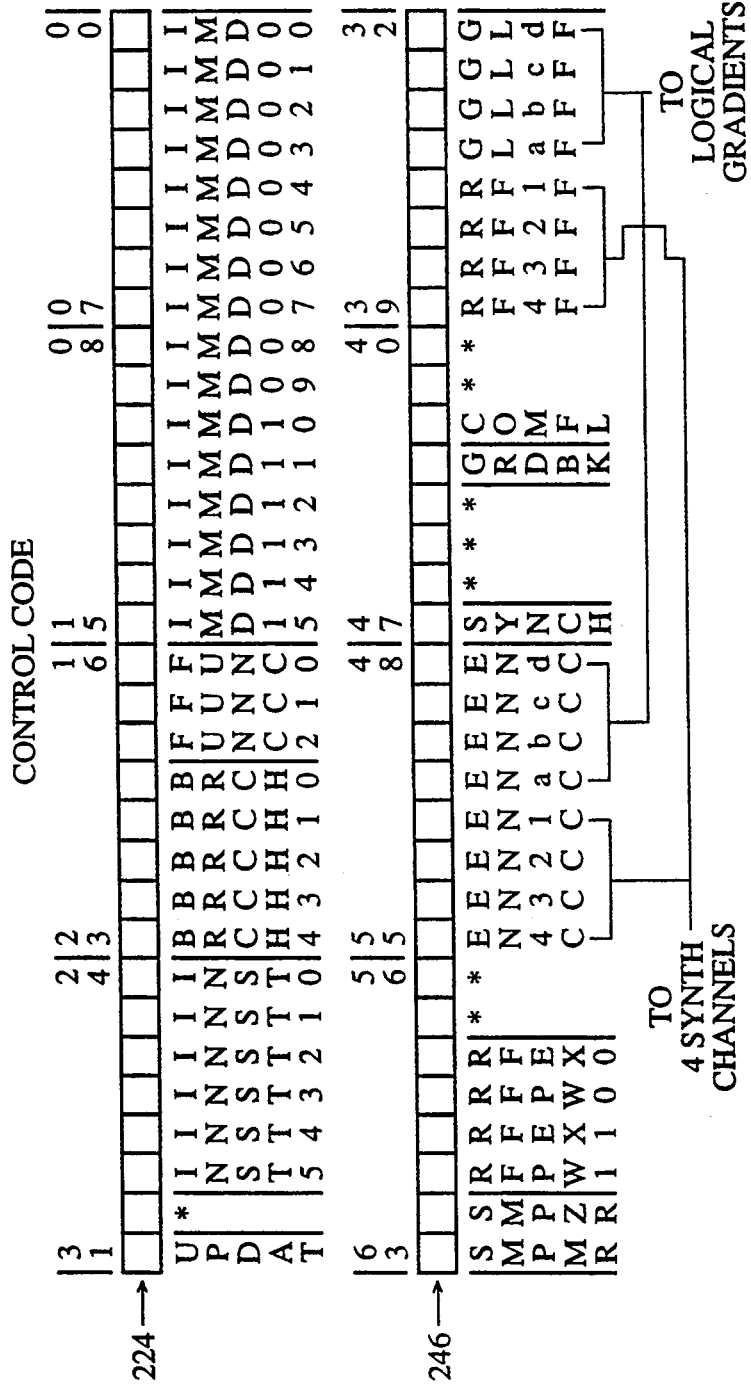
FIG. 8 is a diagram of the contents of an instruction word as used to program the master microcode board.

With particular reference to FIGS. 7 and 8, the preferred embodiment of the master microcode means 90 is now described in yet greater detail. FIG. 7 is a simplified block diagram of the master microcode control board 90. Support logic, interface and control logic, buffers, and like components which are conventional in the art are omitted for simplicity of illustration.

Major inputs and outputs of the master microcode board include general bus interfaces 220, 222 and a channel output register 224. The scan central processor 60, via the interface units 76, 136 is capable of reading and writing the memories and registers within the master microcode means 90 with a conventional memory mapped mechanism. This is implemented across the entire scan sequencer rack 52 as a backplane bus which includes dedicated address and data portions. Similarly, the main output of the master microcode includes control values which are also bussed across the backplane, especially to the RF and gradient channels 92.

Under normal operation, a program of instructions is first stored in the memory 144. An execution address buffer 226 contains an address pointing into the program of instructions. This buffer 226 functions analogously to the program counter of a general purpose computer. The stored program instruction within the memory which is indexed by the address buffer 226 is latched into a control code register 228. As previously discussed, this 64-bit control word is composed of two portions; 32 bits for operation of the state machine, and 32 bits to service the profile channels. Subsequently, this control word is described in much greater detail below in conjunction with FIG. 8.

The 32-bit portion of the control word dedicated to operation of the state machine 142 is distributed to various portions of the board and includes a microsequencer chip 230. This 32-bit sequencer control word portion serves as an instruction to the state machine. The microsequencer chip 230 carries out this instruction, e.g. makes use of various timers, conditionals, stored flags, and the like, also on the board. An output of the microsequencer chip 230, namely its "Y-port", is fed back to the address buffer 226 to become the next instruction address.

This entire set of activities, (selecting an instruction, executing it, and generating a next address instruction), is normally performed once every major cycle, that is once every microsecond. Other less typical modes of operation, such as stopping the entire master microcode, or causing it to execute exactly one instruction then pause, or forcing it to an initial startup address are also supported in the preferred embodiment. Some of these additional modes of operation provide additional flexibility as to how the scan central processor can use the master microcode. Some of these additional modes are intended primarily for hardware and system diagnostic purposes.

The state machine is implemented in separate components besides the microsequencer chip 230. Among these are timers 232 and 234, stored flags 236, various condition code flags 238, and the synchronization flags register device 140. A section of multiplexing hardware 240 takes the preponderance of conditional flags, and determines which of them is mapped to a smaller "T-port" of the microsequencer chip. The FIFO device 180 stores many 16-bit messages which are to be read by the scan central computer 60 when it gets an opportunity to do so. Lines for external physiological conditions are brought from outside the sequencer to the rest of the conditionals and flag circuitry (connections not shown in FIG. 7 for simplicity of illustration). Other devices which appear in FIG. 7 but which are not explicitly numbered or described are mainly buffers or registers of various sorts to facilitate useful interconnection of the above-described components.

With special reference to FIG. 8, the 64-bit master microcode control word is preferably composed to two 32-bit portions 244 and 246. The state machine instruction word 244 contains numerous fields which are used by various portions of the master microcode device 90. The channel output word 246 is distributed via backplane interconnections to the channels and other boards throughout the sequencer device 52.

A 6-bit portion of the state machine instruction word 244 is used to supply data to the instruction port of the microsequencer chip 240. A 5-bit branch select portion drives the conditional multiplexer 240. A 16-bit "immediate data field" contains data which can be used for any of several purposes within the master microcode device. A 3-bit "function" field determines for which purpose the data in the immediate field will be used. As examples, depending upon the bits of the function field, the immediate field may be used as an address or datum inside the microsequencer chip, as an initialization value for the timers 232, 234, as a message to be written into the FIFO 180, to control setting and clearing of stored flags 236, or as a selection of what bits to test for in the synchronization register 140.

One additional bit in the state machine instruction word 244 is used to determine whether the corresponding channel output word 246 will be latched and sent to the channels via the channel output register 224, or whether it will be ignored. If it is ignored, the previous latched value remains in effect. As described before, this mechanism allows for subroutines of commonly executed instructions to be stored once and executed under many different circumstances throughout the duration of the scan, which might otherwise require different patterns to be carried in the channel output word for each circumstance.

The channel output word 246 contains bits which are used for virtually any control and timing purpose by other boards with the sequencer 52. In the preferred embodiment, three groups of these bits are of special importance to the operation of other sequencer portions as previously described. A set of "enable" bits are wired to the various channels, one bit per channel, causing the channels to start and stop. A set of conditional flag bits, also one bit per channel, are also sent to the various channels, so that the channels may use this information in determining whether or not to branch. Another single bit "common flag" is also presented to all the channels simultaneously, again such that any or all channels may be programmed to branch, dependent upon the value of this flag. These enables and flags from the master microcode become the enables 124 and flags 120 used by the various channel state machines.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging system comprising:
   a magnetic field means for generating a temporally constant magnetic field through an examination region;
   gradient field coils for generating gradient magnetic fields across the examination region;
   a radio frequency coil disposed adjacent the magnetic field region for transmitting radio frequency signals into and receiving radio frequency signals from the examination region;
   a display means for displaying human-readable images reconstructed from magnetic resonance data collected from the examination region;
   a central processor means for providing waveform information and timing programs;
   a scan sequencer means including:
      a master sequencer means into which the timing programs from the central processor are loaded,
      a plurality of waveform channel means each having channel memory means for holding at least the waveform information, the channel means are controlled by the master sequencer means to generate a series of radio frequency control signals and a series of gradient control signals in accordance with the waveform information in the channel memory means and the timing program loaded in the master sequencer device,
      a gradient digital-to-analog converter means for converting the gradient control signals into current pulses which are supplied to the gradient field coils,
      a radio frequency synthesizer for converting the radio frequency control signals into radio frequency signals.

2. The system as set forth in claim 1 wherein the master sequencer means includes a microprogrammable sequencer and wherein the radio frequency synthesizer includes a clocking means which clocks the waveform channel means, the microprogrammable sequencer means, and the radio frequency synthesizer.

3. The system as set forth in claim 2 wherein the channel memory means further store timing information and wherein each of the channel means further includes:
   output state registers;
   a state machine engine means which is clocked by the radio frequency synthesizer clocking means for controllably updating the output state registers in accordance with the waveform information held in the channel memory means and timing information from the master sequencer means.

4. The system as set forth in claim 3 further including means for providing interleaved access of the central processor means and the state machine means to the channel memory means such that the state machine means can withdraw waveform information and the central processor means introduces new waveform information alternately.

5. The system as set forth in claim 3 wherein the plurality of waveform channel means includes at least first, second, third, and fourth gradient channel means which are clocked to generate first, second, third, and fourth gradient control signals, the first, second, third, and fourth gradient waveform channel means being independently controlled by the master sequencer means such that each starts and stops independently;
   an obliquing means for converting the at least first, second, third, and fourth gradient waveform control signals into gradient control signals for producing gradients along each of three coordinate directions.

6. The system as set forth in claim 5 wherein each of the channel memory means includes means for storing a plurality of sets of waveform information, the master sequencer device controlling the channels to switch among the sets of waveform information in response to an occurrence of a preselected condition.

7. The system as set forth in claim 3 wherein each of the channel memory means includes means for storing a plurality of sets of waveform information, the master sequencer device controlling the channels to switch among the sets of waveform information in response to an occurrence of a preselected condition.

8. The system as set forth in claim 1 wherein the channel memory means further store timing information and wherein each of the channel means further includes:
   output state registers;
   a state machine means for controllably updating the output state registers in accordance with the waveform information held in the channel memory means and timing information from the master sequencer means.

9. The system as set forth in claim 1 wherein the master sequencer means further monitors states of the waveform channel means and forwards state information and requests for additional sequence information to the central processor.

10. The system as set forth in claim 9 further including a first-in first-out message queue disposed between the central processor means and the master sequencer means for receiving the waveform channel state information and waveform requests therefrom and holding the sequence information and waveform requests in an order received until processed by the central processing means.

11. The system as set forth in claim 1 further including a means for providing interleaved timing access of the central processor means such that the central processor means can replace waveform information to build new scan sequences while the waveform channel means are processing previously stored waveform information from the channel memory means.

12. The system as set forth in claim 1 wherein the plurality of waveform channel means includes:
   at least four gradient waveform channel means which are clocked to generate at least first, second, third, and fourth gradient waveform control signals;

an obliquing means for converting the at least first, second, third, and fourth gradient waveform control signals into gradient control signals for producing gradients along each of three coordinate directions.

13. The system as set forth in claim 12 further including a plurality of sets of pre-emphasis circuits connected with each of the digital-to-analog converter means, each of the plurality of pre-emphasis circuits connected to a common digital-to-analog converter means providing a different pre-emphasis filtering, the pre-emphasis circuits being controlled digitally by the central processing means.

14. The system as set forth in claim 1 wherein each of the channel memory means includes means for storing a plurality of sets of waveform information, the master sequencer device controlling the channels to switch among the sets of waveform information in response to an occurrence of a preselected condition.

15. The system as set forth in claim 1 further including a plurality of sets of pre-emphasis circuits connected with each of the digital-to-analog converter means, each of the plurality of pre-emphasis circuits connected to a common digital-to-analog converter means providing a different pre-emphasis filtering, the pre-emphasis circuits being controlled digitally by the central processing means.

16. A method of controlling scan sequences in a magnetic resonance imaging apparatus that includes a means for generating a temporally constant magnetic field through an examination region, gradient field coils for generating gradient magnetic fields across the examination region, a radio frequency coil for transmitting radio frequency signals into and receiving radio frequency signals from the examination region, and a central processor for providing waveform information and timing programs, the method comprising:

loading waveform information into each of a plurality of waveform channels;

with each waveform channel, under the control of one of the timing programs, generating a series of radio frequency control signals and a series of gradient control signals;

converting the gradient control signals into current pulses and applying the current pulses to the gradient field coil;

frequency synthesizing radio signals from the radio frequency control signals and applying the radio signals to the radio frequency coil.

17. The method as set forth in claim 16 further including controlling the generating of the series of radio frequency and gradient control signals and the radio frequency synthesizing with a common clock.

18. The method as set forth in claim 17 wherein the magnetic resonance imaging apparatus further includes output state registers and a state machine and the method further includes:

clocking the sequencer engine with the clock signals;

as the state machine is clocked, processing and updating information in the output state registers in accordance with the waveform information and the timing programs.

19. The method as set forth in claim 18 further including concurrently monitoring internal and external timing signals while controlling the output information in the state registers.

20. The method as set forth in claim 16 further including:

providing service requests and internal state information to the central processor;

storing the service requests and internal state information in an order received;

processing the stored service requests and internal state information in the stored order, whereby even when the processing is delayed and performed after internal states have changed, the central processor can still determine the state that was current when the service request was made.

21. The method as set forth in claim 20 further including testing for a completion of each service request and determining whether each service request was completed within an allocated time frame.

22. The method as set forth in claim 16 further including interleaving the processing of the waveform information and loading of new waveform information into the channel means to build new scan sequence programs without affecting a scan sequence which is currently being run.

23. The method as set forth in claim 16 wherein the generating of gradient control signals includes:

generating four gradient waveform control signals:

converting the four gradient waveform control signals into three gradient control signals; and converting the three gradient control signals into the current pulses for application to the gradient field coils.

24. The method as set forth in claim 16 further including independently starting and stopping the waveform channel means such that each channel means generates gradient control signals independently of the others.

25. The method as set forth in claim 16 wherein the magnetic resonance imaging apparatus further includes a master sequencer means and the method further includes:

with the master sequencer means, monitoring and tracking a scan sequence;

sending messages to the central processor such that the central processor can track the scan sequence;

some of the messages conveying state of change information and others requesting central processor actions;

with the central processor, processing the change of state information and the action requests in an order received such that the central processor determines the states that have occurred in order and processes the action requests in accordance with a current state at the time the action request was made.

26. The method as set forth in claim 25 further including storing the state change information and the action requests in an interleaved manner prior to processing by the central processor means.

* * * * *